(12) United States Patent
Kim et al.

(10) Patent No.: US 7,843,733 B2
(45) Date of Patent: Nov. 30, 2010

(54) FLASH MEMORY DEVICES HAVING THREE DIMENSIONAL STACK STRUCTURES AND METHODS OF DRIVING SAME

(75) Inventors: Doo-gon Kim, Gyeonggi-do (KR); Ki-tae Park, Gyeonggi-do (KR); Yeong-taek Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 168 days.

(21) Appl. No.: 12/136,933

(22) Filed: Jun. 11, 2008

(65) Prior Publication Data

US 2008/0310230 A1 Dec. 18, 2008

(30) Foreign Application Priority Data

Jun. 12, 2007 (KR) ................. 2007-57517

(51) Int. Cl.
*G11C 16/04* (2006.01)
(52) U.S. Cl. ............... 365/185.11; 365/185.18; 365/185.25
(58) Field of Classification Search ............ 365/185.11, 365/185.18, 185.25
See application file for complete search history.

(56) References Cited

U.S. PATENT DOCUMENTS

| 5,991,224 | A | 11/1999 | Aipperspach et al. |
| 6,028,788 | A * | 2/2000 | Choi et al. ............. 365/185.11 |
| 6,317,353 | B1 * | 11/2001 | Ikeda et al. ................... 365/63 |
| 7,170,786 | B2 * | 1/2007 | Chien et al. ............ 365/185.17 |
| 7,551,490 | B2 * | 6/2009 | Kim ...................... 365/185.25 |
| 7,596,026 | B2 * | 9/2009 | Kwon et al. ........... 365/185.17 |
| 2005/0162927 | A1 | 7/2005 | Chien et al. |

FOREIGN PATENT DOCUMENTS

| JP | 06-053517 | 2/1994 |
| JP | 2002-093184 | 3/2002 |
| JP | 2005-209271 | 8/2005 |

OTHER PUBLICATIONS

Non-Final Rejection, Korean Application No. 10-2007-0057517, Aug. 26, 2008.

* cited by examiner

*Primary Examiner*—Pho M Luu
(74) *Attorney, Agent, or Firm*—Myers Bigel Sibley & Sajovec

(57) ABSTRACT

Flash memory devices are provided including a plurality of layers stacked vertically. Each of the plurality of layers include a plurality of memory cells. A row decoder is electrically coupled to the plurality of layers and configured to supply a wordline voltage to the plurality of layers. Memory cells provided in at least two layers of the plurality of layers belong to a same memory block and wordlines associated with the memory cells in the at least two layers of the plurality of layers are electrically coupled.

27 Claims, 10 Drawing Sheets

FLASH MEMORY DEVICES HAVING THREE DIMENSIONAL STACK STRUCTURES AND METHODS OF DRIVING SAME

CLAIM OF PRIORITY

This application claims the benefit of Korean Patent Application No. 10-2007-0057517, filed on Jun. 12, 2007, in the Korean Intellectual Property Office, the disclosure of which is incorporated herein in its entirety by reference.

FIELD OF THE INVENTION

The present invention relates generally to flash memory devices and, more particularly to, nonvolatile memory devices having a three dimensional (3D) stack structures and methods of driving the same.

BACKGROUND OF THE INVENTION

As mobile systems and various application systems have been developed, a demand for flash memory is increasing. Flash memory, which is a nonvolatile memory device, can be electrically erased and programmed. Flash memory typically has the characteristic that data can be preserved even in a state where power is not supplied. Furthermore, flash memory typically consumes less power than a storing medium based on magnetic disc memory and has a fast access time like in a hard disc.

Flash memory may be classified into NOR flash memory and NAND flash memory based on the connection state between cells and bitlines. In particular, NAND flash memory has a structure in which at least two cell transistors are connected in series to one bitline, and stores and erases data by using a Fowler-Nordheim (F-N) tunneling method. In general, NOR flash memory consumes relatively large amounts of power and thus may not be advantageous to high integration. However, NOR flash memory has an advantage in that it can be easily used even at high speed applications. NAND flash memory uses a smaller cell current than in NOR flash memory and thus is advantageous in terms of high integration.

Recently, as mobile systems have been developed, a larger capacity of memory devices is required. NAND flash memory is advantageous in terms of high integration and, thus, is being used to meet these requirements. However, there is a limitation in using microprocesses of a semiconductor device as the alternatives for increasing memory capacity.

As one of the alternatives for increasing memory capacity, conventional multi-level cell (MLC) technology has been widely used. In MLC technology, one memory cell is programmed using a plurality of threshold voltages and a plurality of bits of data is stored in the one memory cell. However, in MLC technology, a sufficient margin between the threshold voltages should be secured. Thus, the bit number of data that can be stored in one memory cell may be limited.

As another alternative, a 3D stack structure of semiconductor layers that has been used in a memory device such as dynamic random access memory (DRAM) may be applied to a flash memory device. Furthermore, a decoder for driving a memory cell (i.e., X-decoder or Y-decoder) is shared in the 3D stack structure of semiconductor layers so that a chip size can be reduced. However, when a plurality of semiconductor layers are stacked to implement a NAND flash memory device, if general program, read and erase operations are performed to drive the NAND flash memory device, a disturbance may occur during a program and/or read operation or an undesired soft program may be generated in a memory cell that exists in another memory block during an erase operation in a predetermined memory block.

SUMMARY OF THE INVENTION

Some embodiments of the present invention provide a flash memory device including a plurality of layers stacked vertically. Each of the plurality of layers include a plurality of memory cells. A row decoder is electrically coupled to the plurality of layers and configured to supply a wordline voltage to the plurality of layers. Memory cells in at least two layers of the plurality of layers belong to a same memory block and wordlines associated with the memory cells in the at least two layers of the plurality of layers are electrically coupled.

In further embodiments of the present invention, the wordlines associated with the memory cells in the same memory block may be driven using a same row decoder. The plurality of layers may include a first layer and a second layer. A first cell region of the memory cells in the first layer and a second cell region of the memory cells in the second layer may be included in the same memory block.

In still further embodiments of the present invention, wordlines associated with the first cell region and wordlines associated with the second cell region may be electrically coupled. The row decoder may be configured to supply a same wordline voltage to the electrically coupled wordlines.

In some embodiments of the present invention, the same memory block may include a plurality of first cell strings in the first layer and a plurality of second cell strings in the second layer. Each of the first cell strings may include a plurality of first memory cells connected in series and a first string selection transistor and a first ground selection transistor connected to the first memory cells. Each of the second cell strings may include a plurality of second memory cells connected in series and a second string selection transistor and a second ground selection transistor connected to the second memory cells.

In further embodiments of the present invention, each of the first cell strings and the second cell strings may be connected to the same bitline, and one end of each of the first string selection transistor and the second string selection transistor may be connected to the bitline, and one end of each of the first ground selection transistor and the second ground selection transistor is connected to a common source line.

In still further embodiments of the present invention, during a program operation of the device, a first voltage Vpgm used to perform a main program operation is supplied to a wordline of a selected memory cell, and a second voltage Vpass, used to perform a boosting operation, is supplied to wordlines of unselected memory cells.

In some embodiments of the present invention, when a first memory cell is programmed, the first string selection transistor is turned on and the second string selection transistor is turned off, and when a second memory cell is programmed, the first string selection transistor is turned off and the second string selection transistor is turned on.

In further embodiments of the present invention, the program operation may include a pre-charge period before a main program is performed, and during the pre-charge period, at least one of the first cell string and the second cell string is electrically connected to the bitline.

In still further embodiments of the present invention, during a read operation of the device, when a first memory cell is read, the first string selection transistor is turned on and the second string selection transistor is turned off, and when a second memory cell is read, the first string selection transistor is turned off and the second string selection transistor is turned on.

In some embodiments of the present invention, when a first memory cell is read, the first ground selection transistor is turned on and the second ground selection transistor is turned off, and when a second memory cell is read, the first ground selection transistor is turned off and the second ground selection transistor is turned on.

In further embodiments of the present invention, the read operation include a pre-charge period before a main read operation is performed, and during the pre-charge period, at least one of the first cell string and the second cell string is electrically connected to the bitline.

In still further embodiments of the present invention, during an erase operation of the device, the first and second string selection transistors and the first and second ground selection transistors are in a floating state, and an erase voltage Verase of high voltage is applied to a bulk of the first and second layers.

In some embodiments of the present invention, during an erase operation of the memory device, memory cells disposed in the first cell string and the second cell string are simultaneously erased.

In further embodiments of the present invention, an address including a plurality of bits to select the memory cell is supplied to the flash memory device, and at least one bit of the plurality of bits of the address includes information for selecting one of the plurality of layers.

In still further embodiments of the present invention, switching of the first string selection transistor disposed in the first cell string and the second string selection transistor disposed in the second cell string is controlled based on at least one bit for selecting the layers.

In some embodiments of the present invention, switching of the first selection transistor disposed in the first cell string and the second ground selection transistor disposed in the second cell string is controlled based on at least one bit for selecting the layers. In certain embodiments, the device may be a NAND flash memory.

DETAILED DESCRIPTION OF THE INVENTION

Figure 1:
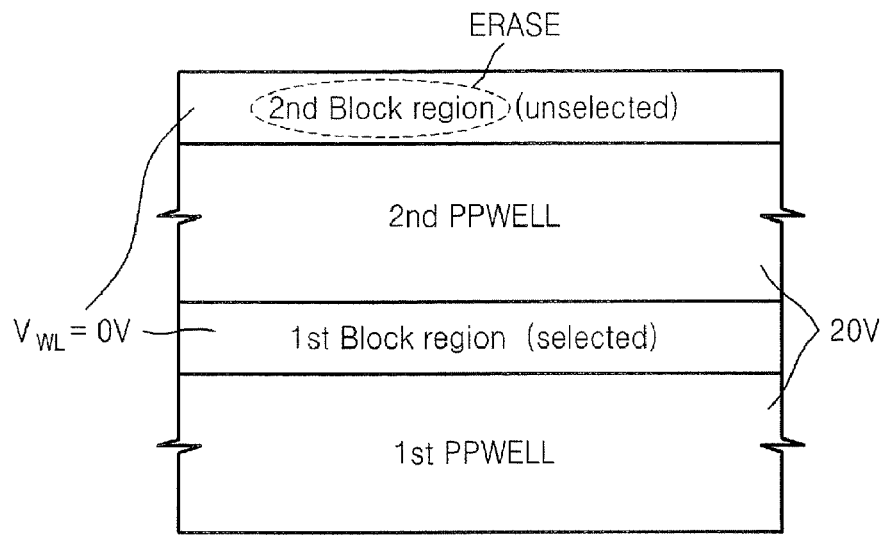
FIG. 1 illustrates is a block diagram illustrating a structure of a flash memory device having a three dimensional (3D) stack structure according to some embodiments of the present invention.

Embodiments of the invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present. In contrast, when an element is referred to as being "directly on" another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first thin film could be termed a second thin film, and, similarly, a second thin film could be termed a first thin film without departing from the teachings of the disclosure.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to other elements as illustrated in the figures. It will be understood that relative terms are intended to encompass different orientations of the device Furthermore to the orientation depicted in the figures. For example, if the device in one of the figures is turned over, elements described as being on the "lower" side of other elements would then be oriented on "upper" sides of the other elements. The exemplary term "lower," can therefore, encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification, and will not be interpreted in an idealized or overly formal sense unless expressly so defined herein.

Some embodiments of the present invention provide flash memory devices in which a plurality of semiconductor layers are stacked so as to improve the degree of integration, and the occurrence of disturbances and a problem of an undesired soft program may be prevented, thus, improving operating performance, and a method of driving the same as will be discussed further below with respect to FIGS. 1 through 9C.

Referring first to FIG. 1, a block diagram illustrating a structure of a flash memory device having a three dimensional (3D) stack structure according to some embodiments of the present invention will be discussed. As illustrated in FIG. 1, a plurality of semiconductor layers, for example, a first semiconductor layer and a second semiconductor layer, are stacked, and a wordline of a first memory block disposed in the first semiconductor layer and a wordline of a second memory block disposed in the second semiconductor layer are driven by the same row decoder (not shown).

An erase operation of the flash memory device is generally performed in memory block units. For example, an erase operation of a first memory block may be performed as follows. First, it is assumed that the wordline of the first memory block and the wordline of the second memory block are driven by the same row decoder (not shown) and a bias voltage applied to each P-WELL (PPWELL) is commonly controlled. In these embodiments, in order to erase memory cells disposed in the first memory block, a wordline voltage of 0V is supplied to the first memory block. Furthermore, an erase voltage Verase of high voltage (approximately 20V) is supplied to P-WELL (PPWELL).

An erase voltage Verase of high voltage is supplied to P-WELL (PPWELL) of the second semiconductor layer, and a voltage of 0V is supplied to the wordline of the second memory block. An erase operation may be performed on an unselected second memory block, and therefore, the first memory block and the second memory block cannot be separately controlled.

Figure 2:
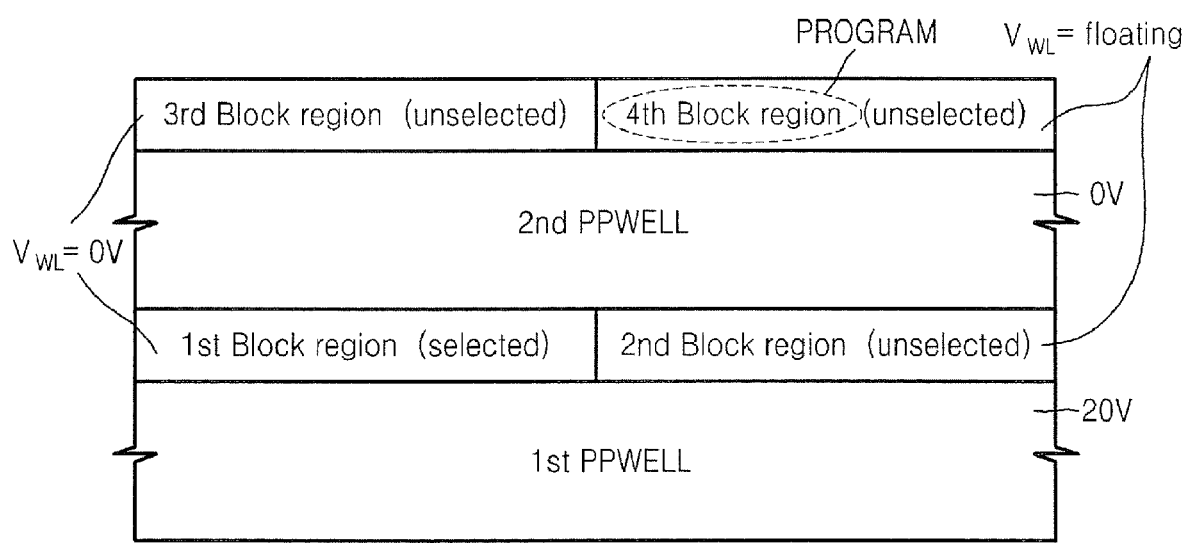
FIG. 2 illustrates is a block diagram illustrating a structure of a flash memory device having a 3D stack structure according to some embodiments of the present invention.

Referring now to FIG. 2, a block diagram illustrating a structure of a flash memory device having a 3D stack structure according to some embodiments of the present invention will be discussed. As illustrated in FIG. 2, two memory blocks disposed on one semiconductor layer. Memory blocks disposed on a first semiconductor layer are referred to herein as a first memory block and a second memory block, and memory blocks disposed on a second semiconductor layer are referred to as a third memory block and a fourth memory block.

In particular, a problem may occur when voltages supplied to each P-WELL(PPWELL) of each of the first and second semiconductor layers are commonly controlled, as illustrated in FIG. 1. Thus, in order to reduce the likelihood of or possibly prevent the problem, bias voltages applied to the P-WELL (PPWELL) of the first semiconductor layer and the P-WELL (PPWELL) of the second semiconductor layer may be separately controlled.

When an erase operation is performed on the first memory block in the flash memory device illustrated in FIG. 2, an Verase voltage (approximately 20V) is applied to P-WELL (PPWELL) of the first semiconductor layer, and a voltage of 0V is applied to P-WELL(PPWELL) of the second semiconductor layer. Furthermore, a voltage of 0V is supplied to the wordline of the first memory block, and a voltage of 0V is supplied to the wordline of a third memory block, which is connected to the wordline of the first memory block.

In order to reduce the likelihood of or possibly prevent an erase operation from being performed on the second memory block of the first semiconductor layer, the wordline of the second memory block is in a floating state. Furthermore, the wordline of a fourth memory block, which is connected to the wordline of the second memory block, is in a floating state.

In these embodiments, a voltage of 0V is applied to the P-WELL (PPWELL) of the fourth memory block of the second semiconductor layer, and the wordline of the fourth memory block is in a floating state. As a wordline voltage of the fourth memory block increases, a problem in which an undesired soft program is executed in memory cells of the fourth memory block occurs. Blocks of the first semiconductor layer and the second semiconductor layer cannot be separately controlled.

In other words, in the flash memory device in which a plurality of semiconductor layers are stacked, when one decoder (in particular, a row decoder) is shared by the plurality of semiconductor layers, the problem that has been described in relation to FIGS. 1 and 2 may occur.

Figure 3:
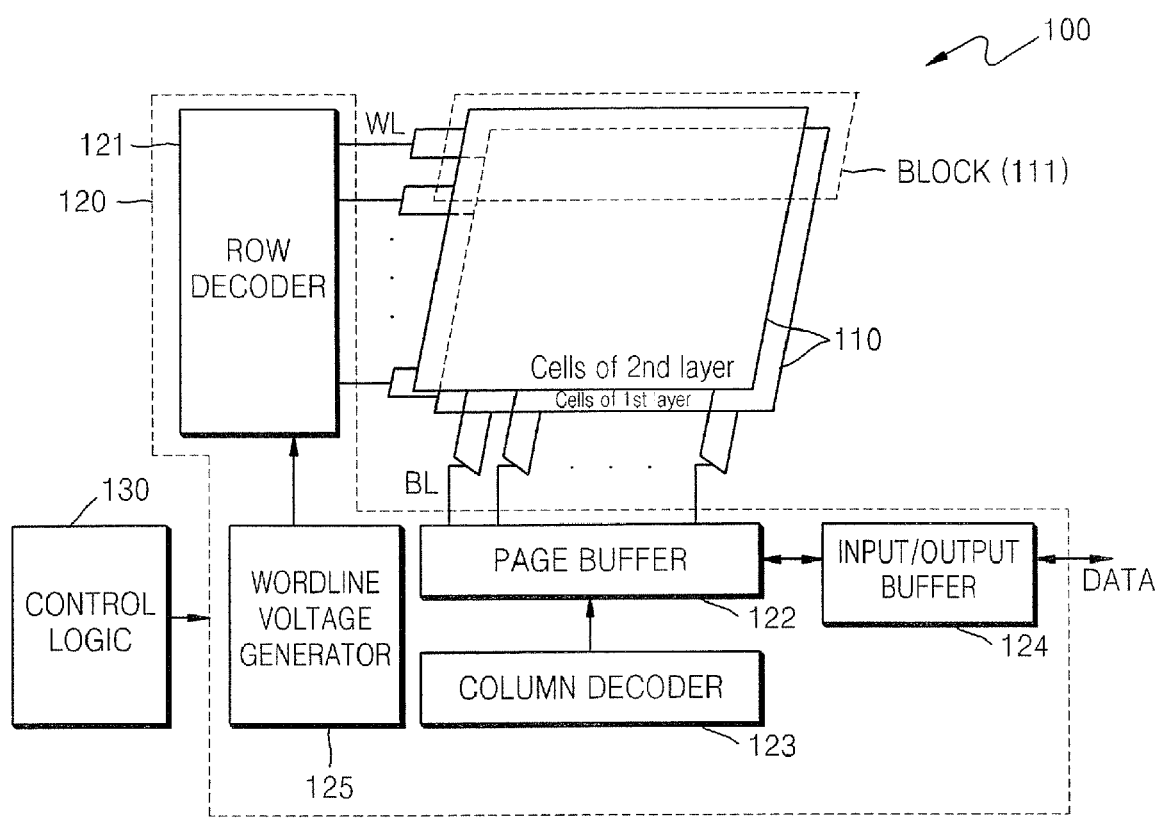
FIG. 3 is a block diagram illustrating flash memory devices according to some embodiments of the present invention.

Referring now to FIG. 3, a block diagram illustrating flash memory devices according to some embodiments of the present invention will be discussed. As illustrated in FIG. 3, the flash memory device 100 includes a memory cell array 110, a peripheral circuit 120 for driving the memory cell array 110, and a control logic 130 for controlling the operation of the peripheral circuit 120. The peripheral circuit 120 may include a row decoder 121 for supplying a voltage to the wordline WL of the memory cell array 110, a page buffer 122 for temporarily storing data transmitted through a bitline BL, a column decoder 123 for selecting the column of the memory cell array 110, an input/output buffer 124 for being connected to the page buffer 122 and inputting and outputting data to and from the outside, and a wordline voltage generator 125 for supplying a wordline voltage to the row decoder 121.

In particular, the memory cell array 110 may include memory cells disposed in a plurality of vertically-stacked layers. For example, the memory cell array 110 may include memory cells disposed in a first semiconductor layer and memory cells disposed in a second semiconductor layer. Wordlines of the memory cells disposed in the first semiconductor layer are electrically connected to wordlines of the memory cells disposed in the second semiconductor layer. The row decoder 121 supplies a common wordline voltage to the first semiconductor layer and the second semiconductor layer. Although only the memory cells disposed in two semiconductor layers are illustrated in FIG. 3, memory cells may be disposed in two or more semiconductor layers without departing from the scope of the present application.

Furthermore, when setting memory blocks to be defined as erase units of the flash memory device, partial memory cells of the first semiconductor layer (hereinafter, referred to as a first cell region) and partial memory cells of the second semiconductor layer (hereinafter, referred to as a second cell region) are set to one block. For example, the first cell region may include memory cells connected to n (where n is an integer that equal to or greater than 1) wordlines in the first semiconductor layer, and the second cell region may include memory cells connected to n wordlines in the second semiconductor layer. Furthermore, as illustrated in FIG. 4, the first wordline of the first cell region and the first wordline of the second cell region may be connected to each other, and subsequently, the second through n-th wordlines of the first and second cell regions may also be connected to one another.

The memory cell array 110 illustrated in FIG. 3 will now be described with reference to FIG. 4. FIG. 4 is a circuit diagram illustrating a cell structure of the flash memory device of FIG.

3. As illustrated in FIG. 4, a plurality of string units 111_1 and 111_2 may be disposed on one memory block of the memory cell array 110, and each of the string units 111_1 and 111_2 is connected to each of bitlines B/L0 and B/L1.

Figure 4:
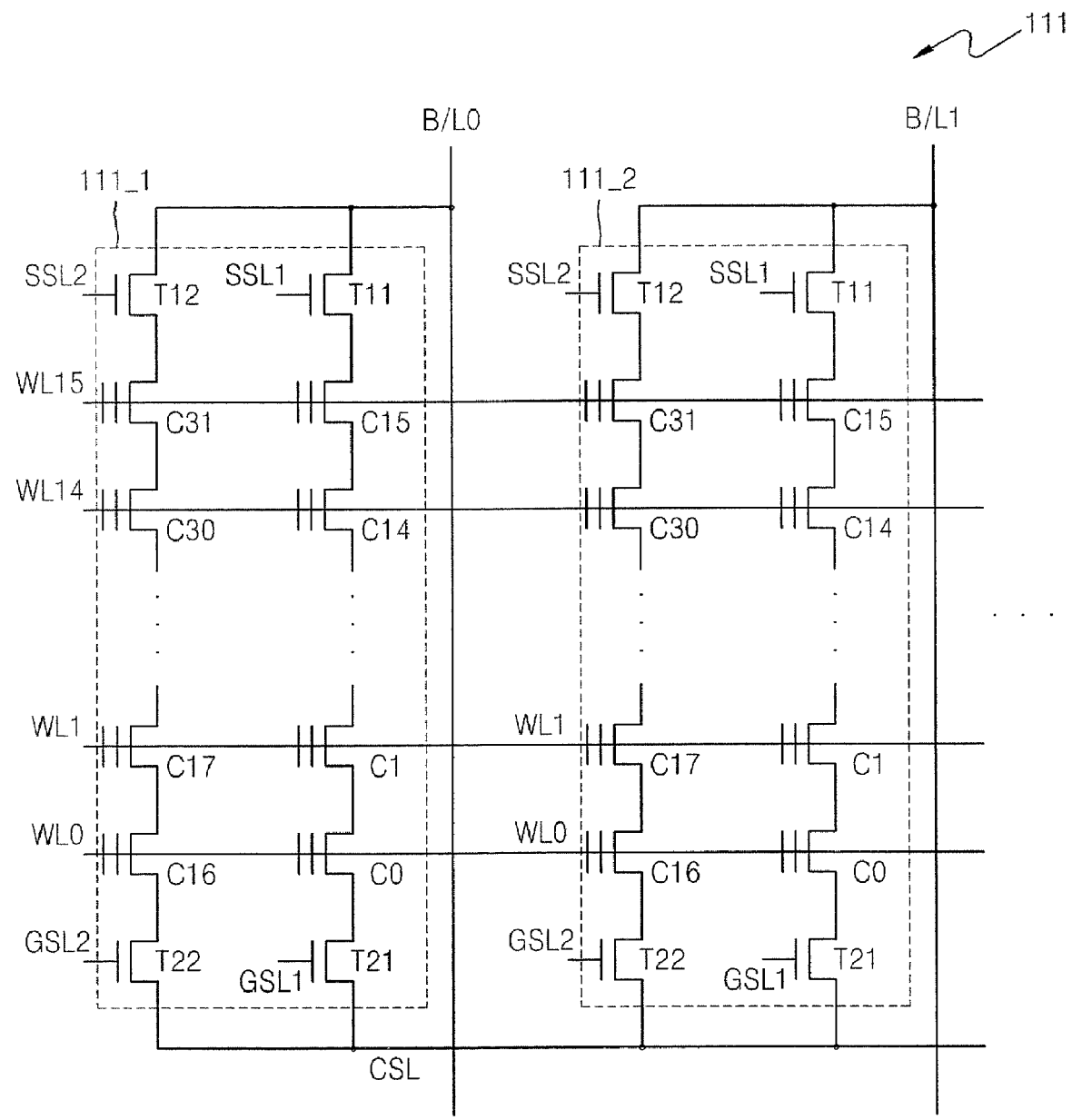
FIG. 4 is a circuit diagram illustrating a cell structure of the flash memory device of FIG. 3.

As further illustrated in FIG. 4, each string unit, for example, the first string unit 111_1, is connected to the bitline B/L0 and includes a first cell string disposed in a first semiconductor layer and a second cell string disposed in a second semiconductor layer. The first cell string includes a plurality of memory cells C0 through C15 connected in series, and the second cell string includes a plurality of memory cells C16 through C31 connected in series.

Furthermore, the first cell string includes a first string selection transistor T11 and a first ground selection transistor T21 connected to the plurality of memory cells C0 through C15. Furthermore, the second cell string includes a second string selection transistor T12 and a second ground selection transistor T22 connected to the plurality of memory cells C16 through C13.

On the other hand, one electrode of the first and second string selection transistors T11 and T12 is connected to the bitline B/L0, and one electrode of the first and second selection transistors T21 and T22 is connected to a common source line CSL. Furthermore, the first string selection transistor T11 and the second string selection transistor T12 are controlled by voltages supplied through the first string selection line SSL1 and the first ground selection transistor T21 and the second ground selection transistor T22 are controlled by a first ground selection line GSL1 and a second ground selection line GSL2.

Furthermore, the memory cells C0 and C16 are controlled by a wordline WL0, and the memory cell C1 and the memory cell C17 are controlled by a wordline WL1, and the memory cell C15 and the memory cell C31 are controlled by a wordline WL15 in the same manner. On the other hand, the configuration of the second string unit 111_2 connected to the bitline B/L1 is similar to the first string unit 111_1 and, thus, a detailed description thereof will be omitted herein.

Figure 5:
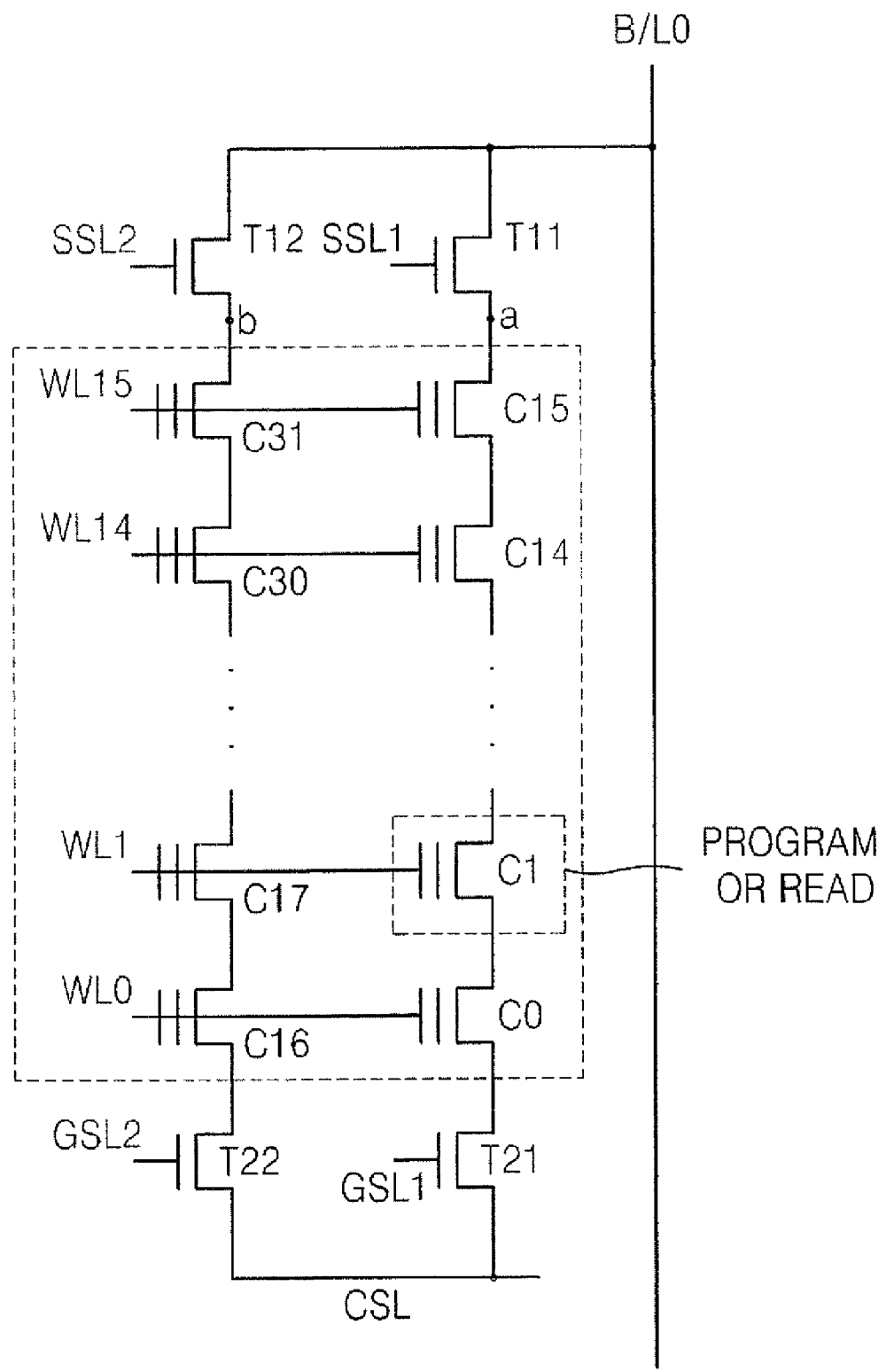
FIG. 5 is a circuit diagram illustrating a string unit connected to one bitline in the cell structure of FIG. 4.

A method of driving a memory cell array having the above-described structure of FIG. 4 will now be described with reference to FIGS. 5 through 8. FIG. 5 is a circuit diagram illustrating a string unit connected to one bitline in the cell structure of FIG. 4. In particular, FIG. 5 illustrates the circuit of the first string unit 111_1. It is assumed that program and read operations are performed in the memory cell C1 disposed in the first cell region. Conditions (program, read and erase operations) for driving the string unit illustrated in FIG. 5 may be set, as shown in Table 1 below.

TABLE 1

| Signal | Program | Erase | Read |
| --- | --- | --- | --- |
| Select W/L | Vpgm | 0 | 0 |
| Unselect W/L | Vpass | 0 | Vread |
| Select B/L | 0 | Floating | 1.0 V |
| Unselect B/L | Vcc | Floating | 0 |
| SSL (1$^{st}$ Floor) | Vcc | Floating | Vread |
| SSL (2$^{nd}$ Floor) | 0 | Floating | 0 |
| GSL (1$^{st}$ Floor) | 0 | Floating | Vread |
| GSL (2$^{nd}$ Floor) | 0 | Floating | 0 |
| CSL | 1.5 V | Floating | 0 |
| PP-WELL (1$^{st}$ Floor) | 0 | Verase | 0 |
| PP-WELL (2$^{nd}$ Floor) | 0 | Verase | 0 |

Figure 6:
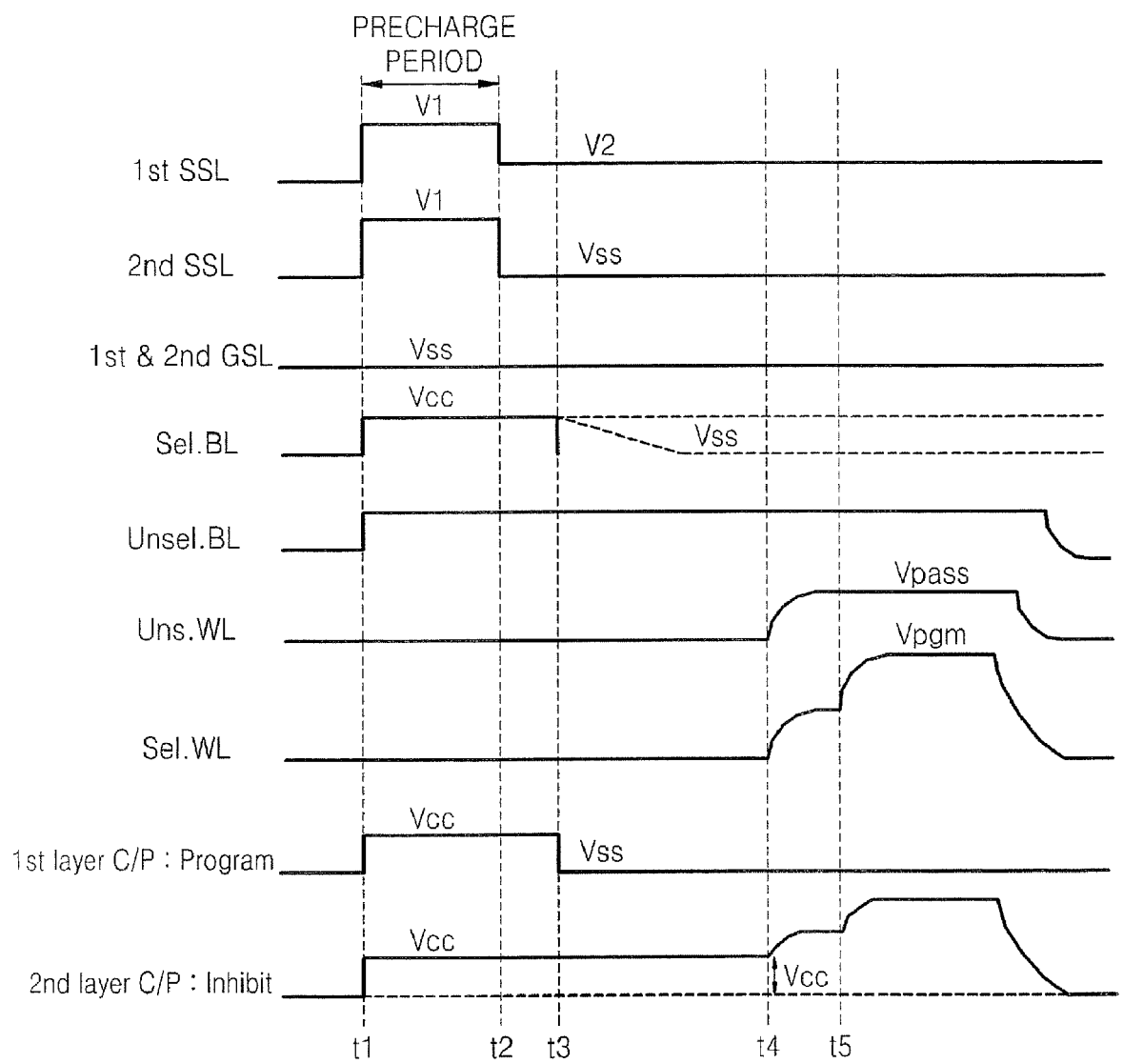
FIG. 6 is a waveform diagram illustrating programming operations of the flash memory device of FIG. 3.
Figure 7:
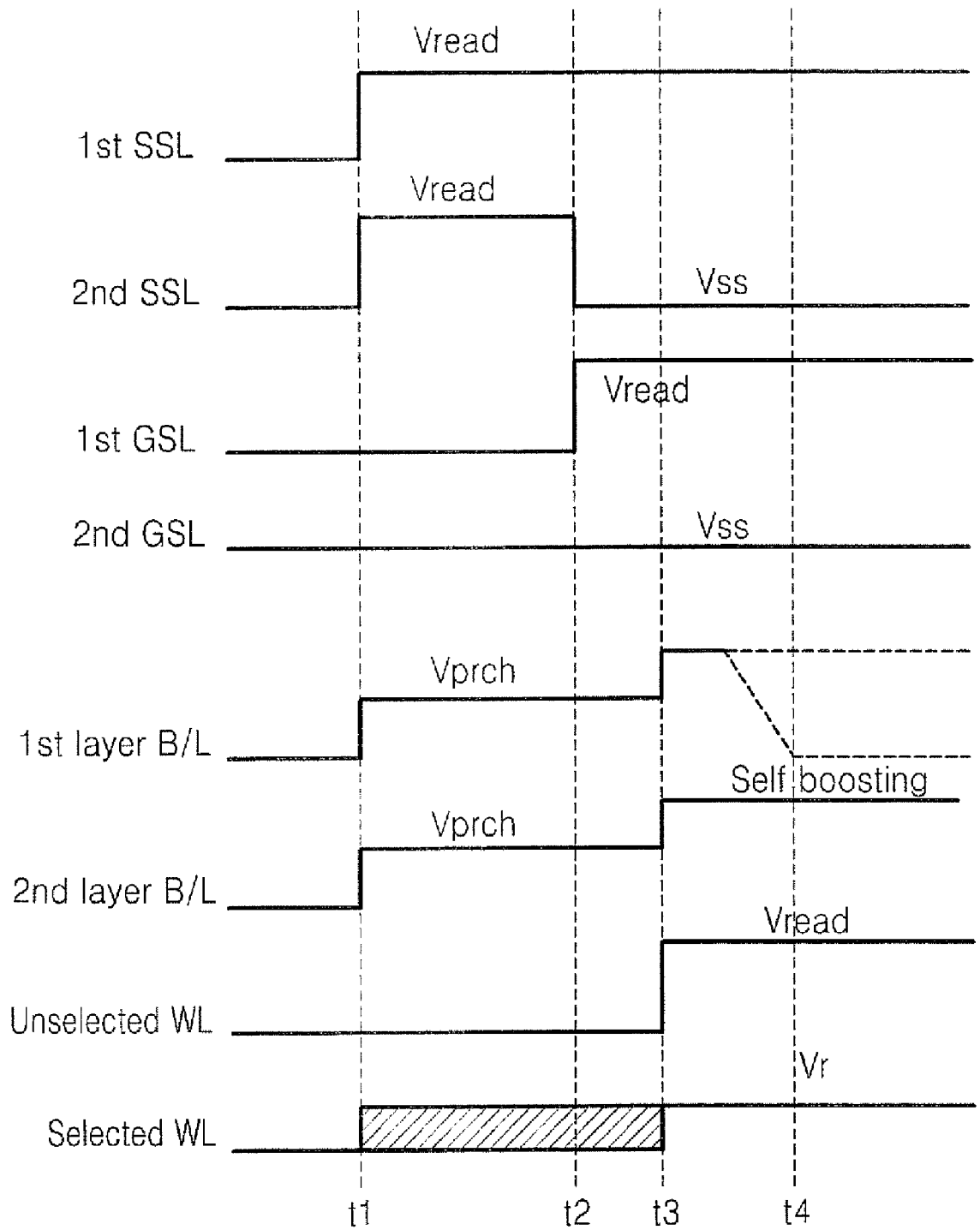
FIG. 7 is a waveform diagram illustrating a read operation of the flash memory device of FIG. 3.
Figure 8:
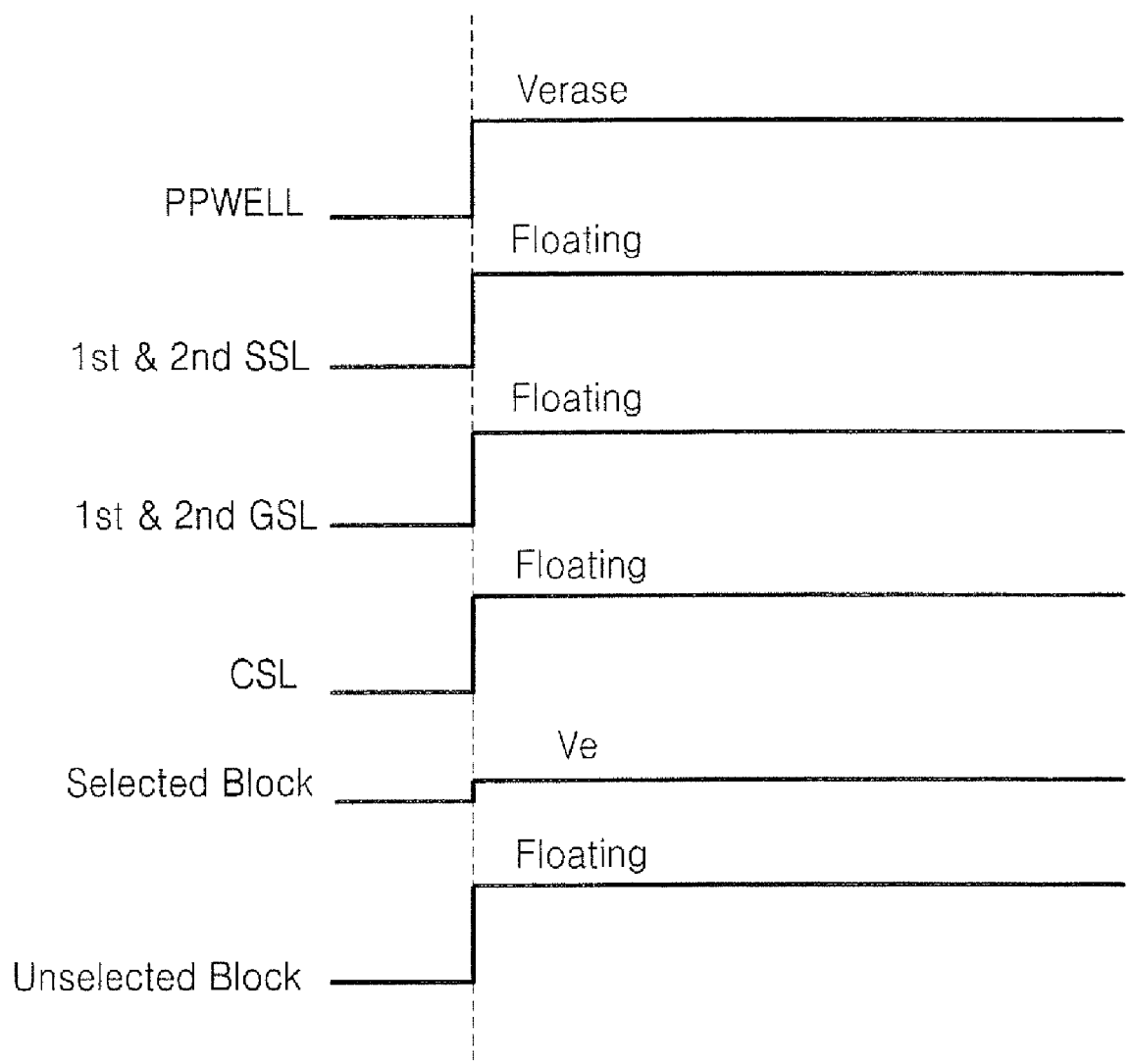
FIG. 8 is a waveform diagram illustrating an erase operation of the flash memory device of FIG. 3.

The flash memory device according to some embodiments of the present invention may be driven under the conditions shown in Table 1, as illustrated in FIGS. 6 through 8.

A program operation in the memory cell C1 is performed as described below. Referring to FIG. 6, a waveform diagram illustrating a program operation of the flash memory device of FIG. 3 will be discussed. A pre-charge operation is performed before a main program operation is performed, as illustrated in FIG. 6. During the pre-charge period, a predetermined voltage V1 is supplied through a first string selection line SSL1 and a second string selection line SSL2. Thus, each of the first string selection transistor T11 and the second string selection transistor T12 is turned on. Furthermore, a predetermined power supply voltage Vcc is supplied to the bitline B/L0 connected to the first string unit 111_1.

By performing the pre-charge operation, a channel potential 1st layer C/P of the first semiconductor layer and a channel potential 2nd layer C/P of the second semiconductor layer that are electrically connected to the bitline B/L0 increase to the level of the power supply voltage Vcc. As the pre-charge operation is completed, a predetermined voltage V2 used to control the turned-on first string selection transistor T11 is supplied to the first string selection line SSL1, and a ground voltage Vss used to turn off the second string selection transistor T12 may be supplied to the second string selection line SSL2. On the other hand, the ground voltage Vss or the power supply voltage VCC is supplied to the selected bitline B/L0. For example, the ground voltage VSS is supplied to supplied to the selected bitline B/L0 when the data "0" is programmed, and the power supply voltage VCC is supplied to the selected bitline B/L0 when the data "1" is programmed. Meanwhile, an undesired VCC is supplied to an unselected bitline to reduce the likelihood of or possibly prevent an undesired soft program.

A predetermined first voltage Vpgm used to perform a main program operation is supplied to a subsequent, selected wordline Sel.WL, for example, WL1, and a second voltage Vpass used to perform a boosting operation is supplied to an unselected wordline Uns.WL.

In the above manner, a program operation is performed in the memory cell C1 of the first cell string according to the program voltage Vpgm. On the other hand, the voltage level of the channel potential C/P of the second semiconductor layer increases by self-boosting. As such, a program operation is inhibited with respect to the memory cells disposed in the second cell string. In other words, the channel potential 2nd layer C/P of the second semiconductor layer is increased during the pre-charge period so that a likelihood of a program disturbance is occurring in the memory cells disposed in the second cell string is reduced.

Referring now to FIG. 7, a waveform diagram illustrating a read operation of the flash memory device of FIG. 3 will be discussed. As illustrated in FIG. 7, a pre-charge operation is performed before a main read operation is performed, and during the pre-charge period, the first string selection transistor T11 and/or the second string selection transistor T12 are turned on.

For example, in FIG. 7, the first string selection transistor T11 and the second string selection transistor T12 are controlled to be turned on. The second string selection transistor T12 is turned on, a bitline (node b) of the second cell string is increased to a pre-charge voltage. Thus, a problem in which a disturbance occurs in the memory cells of the second cell string while a read operation is performed in the first cell string (in particular, a problem in which an undesired soft program is generated) may be prevented.

A read operation will be described with reference to the waveform diagram of FIG. 7. First, during the pre-charge period, a predetermined voltage Vread is applied to the first string selection line SSL1 and the second string selection line SSL2 so that the first string selection transistor T11 and the second string selection transistor T12 are turned on, and a ground voltage Vss is applied to the first ground selection line GSL1 and the second ground selection line GSL2 so that the first ground selection transistor T21 and the second ground selection transistor T22 are turned off. By performing the pre-charge operation, voltages of the bitline (1st layer B/L, node a) of the first cell string and the bitline (2nd layer B/L, node b) of the second cell string electrically connected to the bitline B/L0 increase to a value Vprch.

After the pre-charge period, the first string selection transistor T11 and the first ground selection transistor T21 are controlled to be turned on, and the second string selection transistor T12 and the second ground selection transistor T22 are controlled to be turned off. Furthermore, in order to perform the main read operation, a wordline voltage Vr is applied to the selected wordline Selected WL, and a wordline voltage Vread is applied to the unselected wordline Unselected WL. The size of the wordline voltage Vr may vary according to the characteristic (for example, MLC or SLC) of memory cells to be read or the value of data to be read. Meanwhile, the wordline voltage Vr may be enabled in any portions of periods t1 through t3.

As the second string selection transistor T12 and the second ground selection transistor T22 are turned off, the second cell string is in a floating state, and as the voltage Vread having a predetermined size is applied to the wordlines, the voltage of the bitline 2nd layer B/L of the second cell string is increased by self-boosting. On the other hand, the bitline 1st layer B/L of the first cell string is connected to the bitline B/L0, and the voltage of the bitline B/L0 varies according to the programmed state of the selected cell C1, and the voltage variation is sensed so that data of the selected memory cell C1 can be determined. For example, the voltage of the bitline B/L0 has a logic high or logic low level depending on whether the data of the selected cell C1 is "0" or "1".

In the read operation performed as above, the voltage of the bitline 2nd layer B/L of the unselected second cell string is increased by self-boosting. As such, even when a predetermined voltage Vread (for example, approximately 4.5V) is applied to an unselected wordline, the likelihood of an undesired soft program occurring in the memory cells of the second cell string may be reduced.

On the other hand, the waveform diagrams of FIGS. 6 and 7 illustrate an example of a method of implementing the flash memory device (a program operation, read operation). Driving of the flash memory device according to some embodiments of the present invention is not limited to the characteristic of a particular waveform diagram.

Referring now to FIG. 8, is a waveform diagram illustrating an erase operation of the flash memory device of FIG. 3 will be discussed. As described above, the erase operation of the flash memory device is performed in memory block units. As illustrated in FIG. 8, the erase operation is performed in the memory cells disposed in the first cell string of the first semiconductor layer and the second cell string of the second semiconductor layer, as illustrated in FIG. 8.

In order to perform an erase operation, an erase voltage Verase having a predetermined voltage level (for example, a voltage of 20V) is applied to the P-WELL (PPWELL) of the first semiconductor layer and the second semiconductor layer. On the other hand, the first string selection line SSL1 and the second string selection line SSL2, the first ground selection line GSL1 and the second ground selection line GSL2 and the common source line CSL are in a floating state. Furthermore, a predetermined voltage Ve of 0V or low level is applied to wordlines of a memory block on which an erase operation is to be performed, and wordlines of an unselected memory block are in a floating state.

As described above, in the flash memory device according to some embodiments of the present invention, the memory cells disposed in a plurality of semiconductor layers are set to one memory block, and when an erase operation is performed in memory block units, the memory cells of the plurality of semiconductor layers are simultaneously erased. As such, when only the memory cells disposed in any one semiconductor layer are set to one memory block, a problem in which, when the erase operation is performed in any one memory block, memory cells of the semiconductor layer of another layer are wrongly erased or programmed may be prevented.

On the other hand, in the NAND flash memory device in which a plurality of memory cells are connected in series, memory cells in which program and read operations are to be performed are selected according to address information input to the NAND flash memory device. Each of the first string selection transistor T11 and the second string selection transistor T12 and each of the first ground selection transistor T21 and the second ground selection transistor T22 should be controlled depending on whether the memory cells in which the program and/or read operation is to be performed are disposed in the first semiconductor layer or the second semiconductor layer. This will be discussed further below.

Figure 9A:
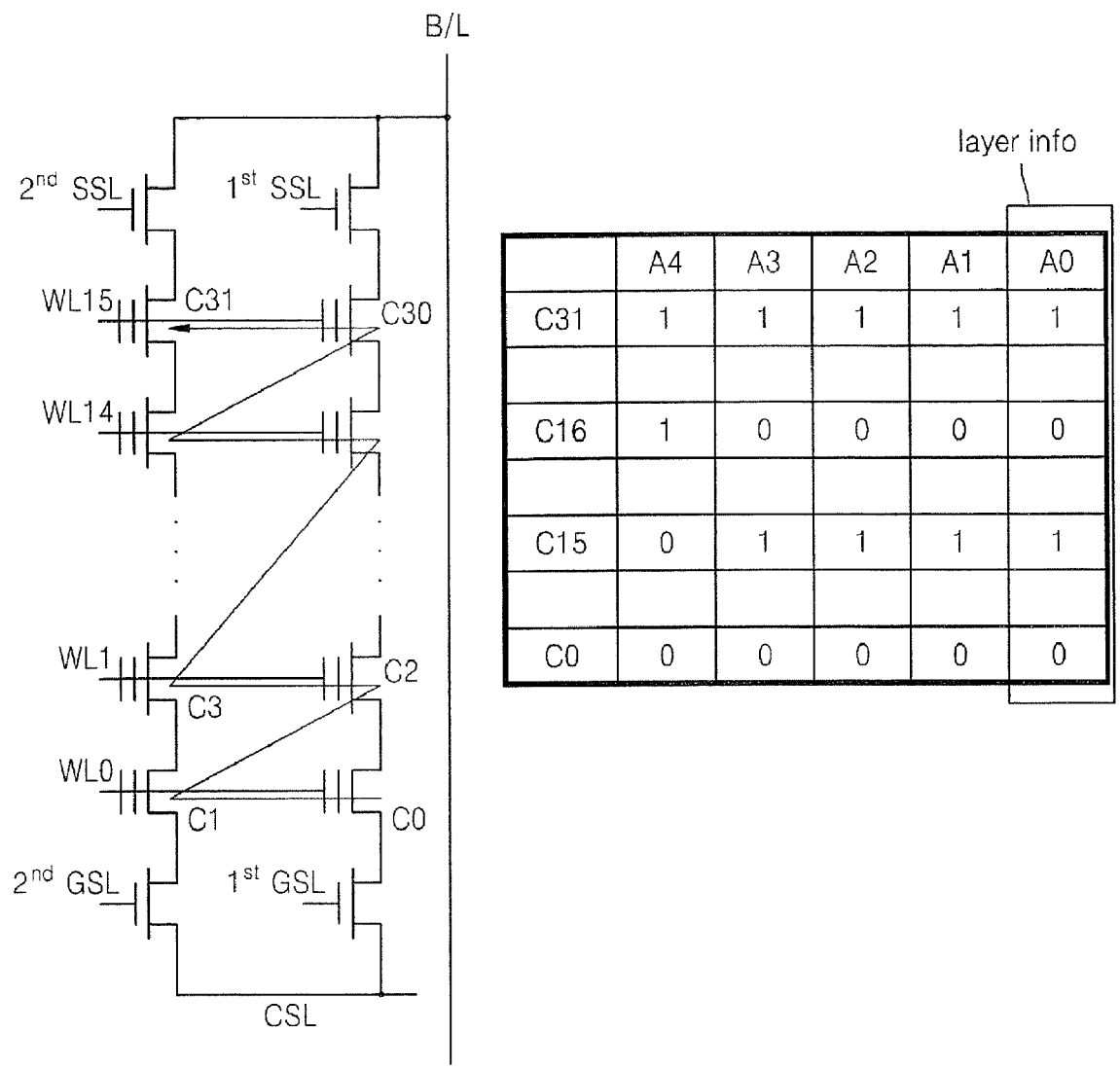
FIGS. 9A, 9B and 9C are circuit diagrams illustrating characteristics of program and/or read operations according to address information in accordance with some embodiments of the present invention.
Figure 9B:
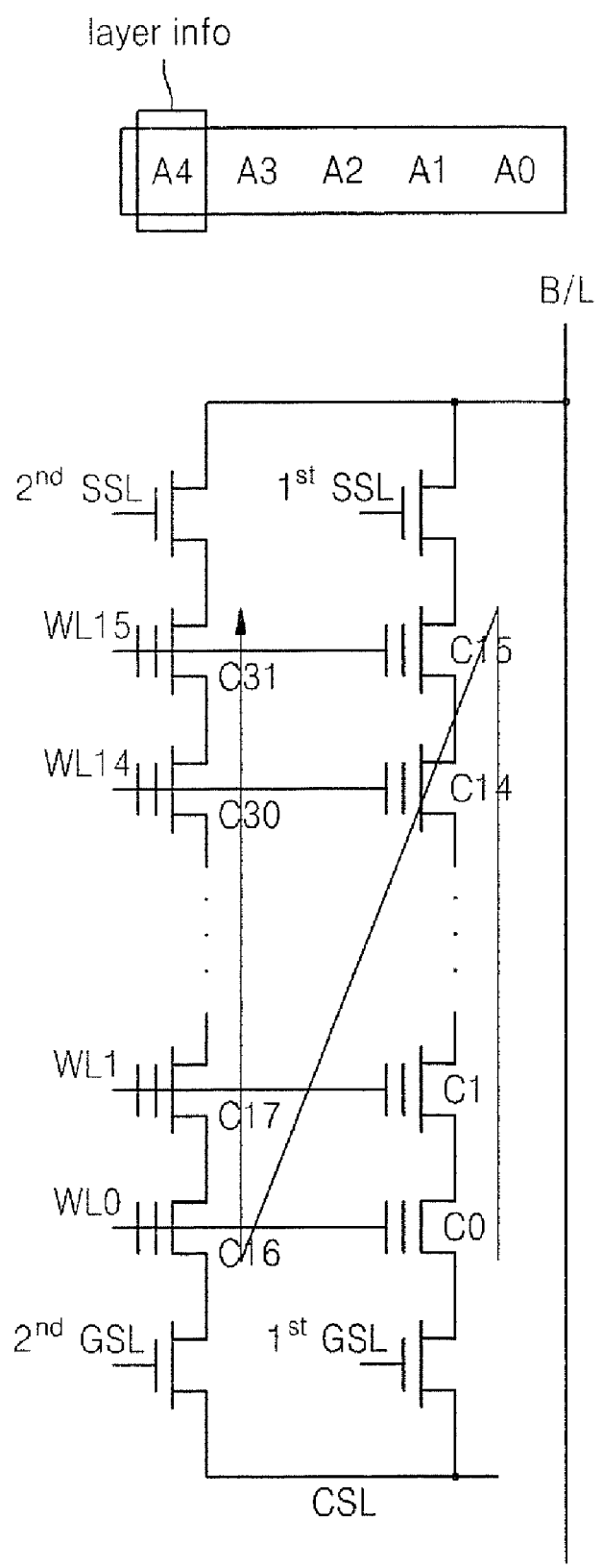
Figure 9C:
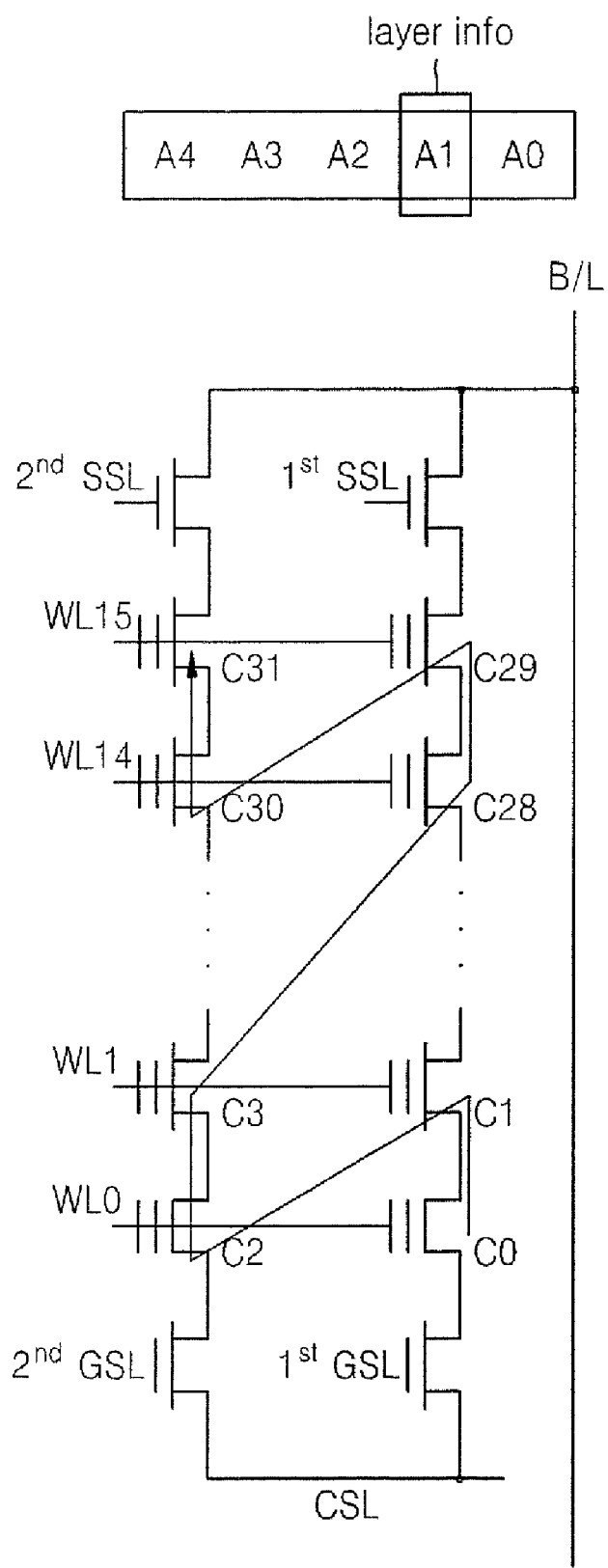

Referring now to FIGS. 9A, 9B, and 9C, circuit diagrams illustrating the characteristics of program and/or read operations according to address information according to some embodiments of the present invention will be discussed. First, as illustrated in FIG. 9A, first cell strings T11, C0, C2, C4, through to C30, and T21 disposed in a first semiconductor layer and second cell strings T12, C1, C3, C5, through to C31, and T22 disposed in a second semiconductor layer are connected to one bitline B/L0. Furthermore, address information (for example, a row address) may include information of 5 bits for selecting 32 memory cells. The number of memory cells disposed in each cell string may vary. Thus, it is well known to one of ordinary skill in the art that the bit number of address information for selecting the memory cells may also vary.

When an address for selecting the memory cells is "00000", a memory cell C0 disposed in the first cell string is selected. Also, when the address is "00001", a memory cell C1 disposed in the second cell string is selected. Furthermore, similarly, when the address is "00010", a memory cell C2 disposed in the first cell string is selected, and when the address is "00011", a memory cell C3 disposed in the second cell string is selected.

In other words, the value of a least significant bit (LSB) of the address of 5 bits has information on a semiconductor layer in which a program or read operation is to be performed. For example, when the address is "00010", the LSB is "0". Thus, it can be determined that the program or read operation is to be performed in the memory cells disposed in the first semiconductor layer using the information. In other words, the control logic 130 shown in FIG. 3 may control the first string selection transistor T11 and the second string selection transistor T12 and the first ground selection transistor T21 and the second ground selection transistor T22 using the LSB information of the address.

FIG. 9B illustrates an example for encoding the address. In other words, when the address is "00000" through "011111", the memory cells C0 through C15 of the first cell string are sequentially selected, and when the address is "10000" through "111111", the memory cells C16 through C31 of the second cell string are sequentially selected.

In the above case, the value of a most significant bit (MSB) of the address has information for selecting semiconductor layers. In other words, when the value of the MSB of the input address is "0", the first semiconductor layer is selected. As such, the first string selection transistor T11 and the second string selection transistor T12 and the first ground selection transistor T21 and the second ground selection transistor T22 are controlled. Furthermore, when the value of the MSB of the input address is "1", the second semiconductor layer is selected and an operation for controlling transistors is performed according to the selected information.

FIG. 9C illustrates another example for encoding the address. Information for selecting semiconductor layers may be positioned in any one of a plurality of bits of address. For example, information for selecting semiconductor layers is positioned in a second bit of the address, memory cells are selected in the order shown in FIG. 9C.

In the flash memory devices and the methods of driving the same according to some embodiments of the present invention, a plurality of semiconductor layers are stacked, a row decoder is shared in the plurality of semiconductor layers such that the degree of integration of the flash memory device is improved. Furthermore, the methods of driving the flash memory device are improved such that the performance of program/read and erase operations is improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

That which is claimed is:

1. A flash memory device having a three dimensional (3D) stack structure, the flash memory device comprising:
a memory array having a 3D structure and including memory cells arranged in a plurality of layers stacked vertically, one layer of the plurality of layers includes memory cells of a first and second directions, and another layer of the plurality of layers includes memory cells of a third direction substantially perpendicular to the first and second directions; and
a row decoder electrically coupled to the plurality of layers and configured to supply a wordline voltage to the plurality of layers,
wherein memory cells in at least two layers of the plurality of layers belong to a same memory block and wherein wordlines associated with the memory cells in the at least two layers of the plurality of layers are electrically coupled.

2. The device of claim 1, wherein the wordlines associated with the memory cells in the same memory block are driven using a same row decoder.

3. The device of claim 1:
wherein the plurality of layers comprises a first layer and a second layer; and
wherein a first cell region of the memory cells in the first layer and a second cell region of the memory cells in the second layer are included in the same memory block.

4. The device of claim 3:
wherein wordlines associated with the first cell region and wordlines associated with the second cell region are electrically coupled; and
wherein the row decoder is configured to supply a same wordline voltage to the electrically coupled wordlines.

5. The device of claim 1, wherein the device is NAND flash memory.

6. The device of claim 1, wherein the first and second directions are respectively X and Y-directions rectangular to each other of the 3D structure, and the third direction is Z-direction substantially perpendicular to the X and Y-directions of the 3D structure.

7. The device of claim 1, wherein an erase operation of the flash memory device is performed in a unit of the same memory block.

8. A flash memory device comprising:
a plurality of layers stacked vertically, each of the plurality of layers including a plurality of memory cells; and
a row decoder electrically coupled to the plurality of layers and configured to supply a wordline voltage to the plurality of layers;
wherein memory cells in at least two layers of the plurality of layers belong to a same memory block and wherein wordlines associated with the memory cells in the at least two layers of the plurality of layers are electrically coupled;
wherein the same memory block comprises a plurality of first cell strings in the first layer and a plurality of second cell strings in the second layer;
wherein each of the first cell strings comprises a plurality of first memory cells connected in series and a first string selection transistor and a first ground selection transistor connected to the first memory cells; and
wherein each of the second cell strings comprises a plurality of second memory cells connected in series and a second string selection transistor and a second ground selection transistor connected to the second memory cells.

9. The device of claim 8, wherein each of the first cell strings and the second cell strings is connected to the same bitline, and one end of each of the first string selection transistor and the second string selection transistor is connected to the bitline, and one end of each of the first ground selection transistor and the second ground selection transistor is connected to a common source line.

10. The device of claim 9, wherein, during a program operation of the device, a first voltage Vpgm used to perform a main program operation is supplied to a wordline of a selected memory cell, and a second voltage Vpass, used to perform a boosting operation, is supplied to wordlines of unselected memory cells.

11. The device of claim 10, wherein, when a first memory cell is programmed, the first string selection transistor is turned on and the second string selection transistor is turned off, and when a second memory cell is programmed, the first string selection transistor is turned off and the second string selection transistor is turned on.

12. The flash memory device of claim 10, wherein the program operation comprises a pre-charge period before a main program is performed, and during the pre-charge period, at least one of the first cell string and the second cell string is electrically connected to the bitline.

13. The device of claim 9, wherein, during a read operation of the device, when a first memory cell is read, the first string selection transistor is turned on and the second string selection transistor is turned off, and when a second memory cell is read, the first string selection transistor is turned off and the second string selection transistor is turned on.

14. The device of claim 13, wherein, when a first memory cell is read, the first ground selection transistor is turned on and the second ground selection transistor is turned off, and when a second memory cell is read, the first ground selection transistor is turned off and the second ground selection transistor is turned on.

15. The device of claim 13, wherein the read operation comprises a pre-charge period before a main read operation is performed, and during the pre-charge period, at least one of the first cell string and the second cell string is electrically connected to the bitline.

16. The device of claim 9, wherein during an erase operation of the device, the first and second string selection transistors and the first and second ground selection transistors are in a floating state, and an erase voltage Verase of high voltage is applied to a bulk of the first and second layers.

17. The device of claim 16, wherein, during an erase operation of the memory device, memory cells disposed in the first cell string and the second cell string are simultaneously erased.

18. The device of claim 8, wherein an address comprising a plurality of bits to select the memory cell is supplied to the flash memory device, and at least one bit of the plurality of bits of the address comprises information for selecting one of the plurality of layers.

19. The device of claim 18, wherein switching of the first string selection transistor disposed in the first cell string and the second string selection transistor disposed in the second cell string is controlled based on at least one bit for selecting the layers.

20. The device of claim 18, wherein switching of the first ground selection transistor disposed in the first cell string and the second ground selection transistor disposed in the second cell string is controlled based on at least one bit for selecting the layers.

21. A method of driving a flash memory device having a three dimensional (3D) stack structure and having at least one memory block, the flash memory device includes a memory array having a 3D structure and including memory cells arranged in a plurality of semiconductor layers stacked vertically, one layer of the plurality of semiconductor layers includes memory cells of a first and second directions, and another one layer of the plurality of semiconductor layers includes memory cells of a third direction substantially perpendicular to the first and second directions, wherein at least one first cell string disposed in a first semiconductor layer and at least one second cell string disposed in a second semiconductor layer stacked on the first semiconductor layer are set to one memory block, and each of wordlines connected to the first cell string and each of wordlines connected to the second cell string are electrically connected to one another, the method comprising:
    erasing the memory device such that memory cells of the first cell string and the second cell string in the one memory block are simultaneously erased.

22. The method of claim 21, wherein an address comprising a plurality of bits to select the memory cells is supplied to the flash memory device, and the address is encoded so that at least one bit has information for selecting the first semiconductor layer or the second semiconductor layer.

23. The method of claim 22, wherein switching of at least one of the first string selection transistor and the first ground selection transistor disposed in the first cell string and the second string selection transistor and the second ground selection transistor disposed in the second cell string is controlled based on at least one bit for selecting the semiconductor layers.

24. A method of driving a flash memory device having at least one memory block, wherein at least one first cell string disposed in a first semiconductor layer and at least one second cell string disposed in a second semiconductor layer stacked on the first semiconductor layer are set to one memory block, and each of wordlines connected to the first cell string and each of wordlines connected to the second cell string are electrically connected to one another, the method comprising:
    erasing the memory device such that memory cells of the first cell string and the second cell string in the one memory block are simultaneously erased,
    wherein programming memory cells included in the first cell string comprises:
    applying a pre-charge voltage to a bitline and connecting the first cell string and the second sell string to the bitline;
    controlling a first string selection transistor to be turned on and controlling a second string selection transistor to be turned off; and
    supplying a first voltage Vpgam used to perform a main program operation to a wordline of a selected memory cell and supplying a second voltage Vpass used to perform a boosting operation to wordlines of unselected memory cells.

25. A method of driving a flash memory device having at least one memory block, wherein at least one first cell string disposed in a first semiconductor layer and at least one second cell string disposed in a second semiconductor layer stacked on the first semiconductor layer are set to one memory block, and each of wordlines connected to the first cell string and each of wordlines connected to the second cell string are electrically connected to one another, the method comprising:
    erasing the memory device such that memory cells of the first cell string and the second cell string in the one memory block are simultaneously erased,
    wherein reading memory cells included in the first cell string comprises:
    applying a pre-charge voltage to a bitline and connecting the first cell string and the second cell string to the bitline;
    controlling the first string selection transistor and the first ground selection transistor to be turned on and controlling the second string selection transistor and the second ground selection transistor to be turned off; and
    supplying a wordline voltage to each of a selected wordline and unselected wordlines.

26. The method of claim 25, wherein during the pre-charge operation the first string selection transistor and the second string selection transistor are turned on so that the first cell string and the second cell string are connected to the bitline.

27. The method of claim 25, wherein during the pre-charge operation a pre-charge voltage is supplied to a selected bitline and unselected bitlines.

* * * * *